US006911298B2

(12) United States Patent
Ide et al.

(10) Patent No.: US 6,911,298 B2
(45) Date of Patent: Jun. 28, 2005

(54) THERMOSENSITIVE PLATE MATERIAL FOR LITHOGRAPHIC PLATE FORMATION, PROCESS FOR PRODUCING THE SAME, COATING FLUID, AND LITHOGRAPHIC PLATE

(75) Inventors: Youichiroh Ide, Shizuoka (JP); Seiji Sato, Kanagawa (JP); Minoru Hayashi, Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 103 days.

(21) Appl. No.: 10/472,947

(22) PCT Filed: Nov. 22, 2001

(86) PCT No.: PCT/JP01/10243

§ 371 (c)(1), (2), (4) Date: Sep. 26, 2003

(87) PCT Pub. No.: WO02/076758

PCT Pub. Date: Oct. 3, 2002

(65) Prior Publication Data

US 2004/0110082 A1 Jun. 10, 2004

(30) Foreign Application Priority Data

Mar. 26, 2001 (JP) ....................................... 2001-088139

(51) Int. Cl.[7] .................................................. G03F 7/09

(52) U.S. Cl. ................. 430/270.1; 430/138; 430/271.1; 430/302

(58) Field of Search .............................. 430/138, 270.1, 430/271.1, 302

(56) References Cited

U.S. PATENT DOCUMENTS

| | | | | | |
|---|---|---|---|---|---|
| 5,569,573 | A | | 10/1996 | Takahashi et al. | |
| 6,686,125 | B2 | * | 2/2004 | Hoshi et al. | 430/271.1 |
| 6,821,704 | B1 | * | 11/2004 | Ide et al. | 430/270.1 |
| 2004/0081913 | A1 | * | 4/2004 | Mori | 430/271.1 |

FOREIGN PATENT DOCUMENTS

| | | | |
|---|---|---|---|
| EP | 0 949 088 | A1 | 10/1999 |
| EP | 1 172 229 | A1 | 1/2002 |
| JP | 07-001849 | A | 1/1995 |

* cited by examiner

*Primary Examiner*—Barbara L. Gilliam
(74) *Attorney, Agent, or Firm*—Burns, Doane, Swecker & Mathis, L.L.P.

(57) ABSTRACT

A thermosensitive plate material for lithographic plate formation according to the present invention includes a substrate (1) and a thermosensitive layer (2) formed thereon. The thermosensitive layer (2) includes an organic polymer (4) containing lipophilic portion forming particles (3). In the thermosensitive layer (2), a surface portion (21) having a thickness of 0.1 μm or more does not contain the lipophilic portion forming particles (3) but contains a metal oxide (5). The surface portion (21) includes a hydrophilic organic polymer (41), which has been cured with the metal oxide (5). A portion (22) of the thermosensitive layer (2) on the substrate side contains the lipophilic portion forming particles (3). The organic polymer (42) constituting the base portion (22) need not be the hydrophilic organic polymer.

21 Claims, 2 Drawing Sheets

THERMOSENSITIVE PLATE MATERIAL FOR LITHOGRAPHIC PLATE FORMATION, PROCESS FOR PRODUCING THE SAME, COATING FLUID, AND LITHOGRAPHIC PLATE

TECHNICAL FIELD

The present invention relates to a thermosensitive plate material for lithographic plate formation that can be used for a CTP (Computer To Plate) system, a process for producing the same, a coating liquid used for producing the plate material, and a lithographic plate obtained by subjecting the plate material to plate-making.

BACKGROUND ART

There have been proposed plate-making methods of a lithographic plate using a computer. In particular, in a CTP system, plate making is performed by printing print image information edited and produced by way of DTP (desktop publishing) directly on a plate material without any imaging processing, using a laser or thermal head. This CTP system is extremely prospective in the field of commercial printing because the system will enable rationalization of plate making process, reduction in time needed for plate making, and reduction in material cost.

In regard to plate materials for use in such a CTP system, the present applicants propose a thermosensitive plate material which has a printing surface (surface on which ink is put at the time of printing) on which an ink receiving portion and an ink non-receiving portion are formed by writing with heat according to the print image information, and which requires no development process and provides a lithographic plate excellent in printing resistance. This plate material is called "thermosensitive plate material for lithographic plate formation".

The lithographic plates obtained by the plate making with this plate material are used for, for example, printing using oil-based ink, and, on the printing surface, an oil-based ink receiving portion (lipophilic portion) and an oil-based ink non-receiving portion (hydrophilic portion) are formed at the time of plate making. Upon printing, the ink is retained in the lipophilic portion on the printing surface, and in the offset printing, an image corresponding to the lipophilic portion on the printing surface is formed on paper by pressing the ink against the paper via a rubber blanket.

For example, JP 7-1849 A discloses a thermosensitive material for use in plate material which contains a micro-capsule with a component (lipophilic component) being to form an lipophilic portion (image portion) by heat and a hydrophilic polymer (hydrophilic binder polymer). The hydrophilic polymer has a functional group capable of three-dimensionally crosslinking and a functional group reacting and chemically bonding with the lipophilic component in the micro-capsule after fracture of the micro-capsule resulting from application of heat.

The publication also discloses a plate material produced by forming a thermosensitive layer (hydrophilic layer) composed of the above described thermosensitive material on the surface of a support and then three-dimensionally crosslinking the hydrophilic polymer. According to the publication, this plate material is constructed in such a manner that the lipophilic component in the micro-capsule forms a polymer and becomes an lipophilic portion (image portion) once the micro-capsule is fractured by heat during plate-making, and at the same time, the lipophilic component reacts and chemically bonds with the hydrophilic polymer.

As a result, the plate material does not require the development process in the plate making operation, and the lithographic plates obtained are markedly excellent not only in printing resistance but also in the performance of the hydrophilic portion (non-image portion), whereby clear printed matter free from scumming (slight smears which are uniformly formed) can be obtained.

In addition, WO (international publication) 98/29258 discloses a method of further enhancing the printing resistance of the plate materials described in JP 7-1849 A in which three-dimensional crosslinking of the hydrophilic polymer is generated by allowing Lewis base moieties containing nitrogen, oxygen, or sulfur and polyvalent metal ions, such as tin, to interact with each other.

The publication also describes a method of stabilizing the hydrophilic portion (non-image portion) on the printing surface as well as preventing dirt from adhering to the printing surface by forming a hydrophilic polymer thin film layer, as a protective agent for the surface, on the surface of a thermosensitive layer (hydrophilic layer).

With the plate materials described in the above publications, the lithographic plates which do not require the development process and are excellent in printing resistance as well as in performance of the hydrophilic portion (oil-based ink non-receiving portion) can be obtained, as described above. These plate materials, however, leave much to be improved in terms of mechanical strength and printing performance (in particular, preventing dirt in the portion where an image of a printed matter is not formed (non-image portion)) of the lithographic plate obtained by the plate making.

In contrast, WO 00/63026 discloses that the mechanical strength and printing performance of a lithographic plate are enhanced, which is obtained by allowing a polyvalent metal oxide or molecules having bonds represented by $(SiO_2)_n$ to be contained in a thermosensitive layer of a thermosensitive plate material for lithographic plate formation and subjecting the plate material to plate-making. However, this plate material can also be further improved in terms of the printing performance (in particular, a non-image portion is unlikely to be contaminated) of printed matter by a lithographic plate obtained by plate-making.

On the other hand, JP 2000-25353 A describes that a porous configuration with an average pore diameter of 0.05 to 1 μm is formed on the surface of a hydrophilic layer containing a lipophilic component and a hydrophilic binder polymer that are micro-capsulated, which is a thermosensitive layer of a thermosensitive plate material for lithographic plate formation. Furthermore, it is described that if a lithographic plate obtained by subjecting the plate material to plate-making is used, special dampening water is not required for printing, and the amount of dampening water to be used can be minimized.

However, in the plate material described in the above publication, micro-capsules are present on a surface side of the thermosensitive layer (for example, in a portion within 0.1 μm from the surface). Therefore, the micro-capsules are likely to be exposed to the surface of a lithographic plate obtained by subjecting the plate material to plate-making during printing. Therefore, in the case where the surfaces of the micro-capsules do not have sufficient hydrophilicity, oil-based ink adheres to the exposed micro-capsules, which may cause scumming in the non-image portion of the printed matter.

JP 2001-18547 A describes that a printing plate excellent in hydrophilicity, water resistance, and printing resistance is obtained by making the surface of a hydrophilic layer mainly made of an organic substance porous. However, when a porous configuration mainly made of the organic substance is present on the surface of the printing plate, the mechanical strength required for the printing plate is difficult to obtain.

JP 2001-30645 A describes that, as a thermosensitive layer of a thermosensitive plate material for lithographic plate formation, a layer is formed in which composite particles at least composed of a hydrophobic precursor and a photothermal conversion agent are dispersed in a hydrophilic medium. In this plate material, by using a sol-gel converting material as the medium, a high printing performance is obtained. Furthermore, JP 2001-30645 A describes that resin having a siloxane bond and a silanol group is preferable as the medium.

Furthermore, WO98/40212 and WO98/40213 describe a plate material having a specific lipophilic layer and lipophobic layer on a substrate, which can be produced easily at a low cost without a development process.

In the plate materials described in these publications, the lipophilic layer is formed on the substrate, and the lipophobic layer is formed thereon. The lipophobic layer is composed of a colloid made of a specific metal oxide or metal hydroxide, and a matrix made of a cross-linking polymer. In the plate materials described in these publications, the matrix made of the cross-linking polymer is considered to be formed by sol-gel conversion and dehydration and condensation of a silane coupling agent.

However, the elasticity of the layer formed by the sol-gel conversion and the dehydration and condensation of the silane coupling agent is not sufficient for a printing plate.

JP 11-334239 A describes that a plate material to be subjected to plate-making by ablation includes a photosensitive layer and a hydrophilic layer formed on a substrate in this order, and fine particles of titanium oxide and/or zinc oxide are contained in the hydrophilic layer so as to enhance a removal efficiency of the hydrophilic layer.

However, this plate material has problems in that substances scattering during ablation may contaminate an optical system to be used for ablation and adhere to an obtained plate.

A first object of the present invention is to provide a thermosensitive plate material for lithographic plate formation requiring no development process, in which a printing performance (in particular, a non-image portion is unlikely to be contaminated) of printed matter by a lithographic plate obtained by subjecting the plate material to plate-making is enhanced, and which has mechanical strength required for a printing plate.

A second object of the present invention is to enhance a water-retention capacity of a lithographic plate obtained by plate-making and reduce an amount of dampening water to be used during printing, while achieving the above-mentioned first object.

DISCLOSURE OF THE INVENTION

<Thermosensitive Plate Material for Lithographic Plate Formation of the Present Invention>

In order to achieve the above-mentioned objects, according to the present invention, there is provided a thermosensitive plate material for lithographic plate formation including a thermosensitive layer having fine particles that are changed by heat to form lipophilic portions on a printing surface (or in an upper portion in a recording layer) (hereinafter referred to as "lipophilic portion forming particles") and an organic polymer, which is supported by a substrate, characterized in that: a surface portion that is on a surface side of the thermosensitive layer does not contain the fine particles and contains a metal oxide, a hydrophilic organic polymer is cured (hardened) with the metal oxide, and the surface portion has a thickness of 0.1 μm or more; and a base portion that is on a substrate-side portion of the thermosensitive layer from the surface portion contains the fine particles in an organic polymer.

In the plate material, a thermosensitive layer 2 is supported by a substrate 1, as shown in FIG. 1. The thermosensitive layer 2 is made of an organic polymer 4 containing lipophilic portion forming particles 3. In a portion (portion with a thickness of 0.1 μm or more from the surface: surface portion) 21 on a surface side of the thermosensitive layer 2, the lipophilic portion forming particles 3 are not present, and a metal oxide 5 is present. The surface portion 21 is made of a hydrophilic organic polymer 41, and the polymer 41 is cured by the metal oxide 5. A portion (base portion) 22 on a substrate side of the thermosensitive layer 2 contains the lipophilic portion forming particles 3. An organic polymer 42 forming the base portion 22 may not be a hydrophilic organic polymer.

When the plate material of the present invention is subjected to plate-making, in the same way as in a general thermosensitive plate material for lithographic plate formation, heat is applied to a portion corresponding to an oil-based ink receiving portion of the thermosensitive layer to change the lipophilic portion forming particles present in that portion, whereby a lipophilic portion (oil-based ink receiving portion) is formed. The particles present in a portion that is not to be heated remain as they are in an organic polymer of the thermosensitive layer even after plate-making.

The thermosensitive layer of the plate material of the present invention has a surface portion containing no lipophilic portion forming particles with a thickness of 0.1 μm or more. Therefore, in a surface layer portion of a lithographic plate obtained by subjecting the plate material to plate-making, the lipophilic portion forming particles are not present in a thickness corresponding to the thickness of the surface portion. Furthermore, the hydrophilic organic polymer forming the surface portion is cured (hardened) by a metal oxide, so that the surface layer portion of the resultant lithographic plate also has hardness accordingly. More specifically, the lithographic plate obtained from the plate material of the present invention is harder than a conventional lithographic plate (lithographic plate obtained from a plate material in which a hydrophilic organic polymer forming the surface portion of a thermosensitive layer is not cured by a metal oxide).

For that reason, in the lithographic plate obtained from the plate material of the present invention, the lipophilic portion forming particles are unlikely to be exposed to the surface during printing. Therefore, when printing is performed by using the lithographic plate obtained from the plate material of the present invention, a portion (non-image portion) of the printed matter in which an image is not formed is unlikely to be contaminated. Furthermore, the lithographic plate obtained from the plate material of the present invention has a surface layer portion that is harder than that of a conventional lithographic plate. Therefore, a printing resistance is enhanced compared with the conventional lithographic plate.

In the plate material of the present invention, the thickness of the surface portion needs to be 0.1 μm or more in the entire plane of the plate material; however, the thickness of the surface portion may not be uniform in the plane of the plate material. When the thickness of the surface portion is less than 0.1 μm, the above-mentioned effect cannot be substantially obtained.

Furthermore, when the surface portion is too thick, heat is unlikely to reach the lipophilic portion forming particles present in the base portion during heating for plate-making, which considerably prolongs an operation for plate-making or makes it impossible to perform plate-making. In this respect, the thickness of the surface portion is set to be, for example, 10 μm or less.

A preferable range of the thickness of the surface portion varies depending upon a laser intensity to be used during plate-making, the number of print copies through printing by using a lithographic plate to be produced, and the like. For example, the thickness of the surface portion is in a range of 0.2 μm to 5 μm.

The ratio of the hydrophilic organic polymer and the metal oxide forming the surface portion is set to be, for example, hydrophilic organic polymer/metal oxide=95/5 to 1/99 in a mass ratio of the hydrophilic organic polymer to the metal oxide. It is preferable that hydrophilic organic polymer/metal oxide=75/25 to 5/95. When the ratio is small (i.e., the amount of the hydrophilic organic polymer is small, and the amount of metal oxide is large), the hydrophilic property of the surface portion is insufficient, and the surface portion is too hard. When the ratio is large (i.e., the amount of hydrophilic organic polymer is large, and the amount of metal oxide is small), the mechanical strength of the surface portion is insufficient.

<Mechanism of Curing by a Metal Oxide>

A mechanism that a metal oxide acts to cure (harden) a hydrophilic organic polymer has not been clarified. However, the mechanism can be assumed as follows from an analysis result obtained by using an infrared absorption spectrum (IR), X-ray diffraction (XRD), nuclear magnetic resonance spectrum (NMR), and the like.

In general, the surface of a particle made of a metal oxide has a portion where metal atoms and/or oxygen atoms are exposed in an unsaturated state (in a state where either valence is not satisfied) and a potion where OH-groups are present. The exposed metal atoms and/or oxygen atoms, and OH-groups are considered to function as a cross-linking agent of the hydrophilic organic polymer. In particular, OH-groups form stable hydrogen bonds with hydrophilic groups of a hydrophilic polymer. Therefore, particles made of the metal oxide are assumed to become an effective cross-linking agent of the hydrophilic polymer.

For example, in the case where the hydrophilic organic polymer is polyacrylic acid, and the metal oxide is tin oxide ($SnO_2$), an $SnO_2$ particle is present among a plurality of carboxyl groups (hydrophilic groups) of polyacrylic acid, and a plurality of OH-groups present on the surface of the $SnO_2$ particle form hydrogen bonds with carboxyl groups of polyacrylic acid.

Because of this, polyacrylic acid is cross-linked by the $SnO_2$ particle. Furthermore, this cross-linking will not impair the hydrophilic property owing to carboxyl groups. As a result, the cross-linked polyacrylic acid is insoluble in water while being hydrophilic, and is harder than polyacrylic acid that is not cross-linked. Furthermore, even if a cross-linking degree is high, high hydrophilic property in the hydrophilic portion can be kept.

<Organic Polymer Forming a Surface Portion>

In the plate material of the present invention, an organic polymer forming a surface portion as a portion on a surface side of a thermosensitive layer is a hydrophilic organic polymer.

An organic polymer is a polymer composed of an organic compound. For example, a polymer such as, poly(meth)acrylate type, polyoxyalkylene type, polyurethane type, epoxy ring-opening addition polymerization type, poly(meth)acrylic acid type, poly(meth)acrylamide type, polyester type, polyamide type, polyamine type, polyvinyl type, polysaccharide type, or composite types thereof can be given.

Polymers having those organic polymers as a basic skeleton and each having at least one hydrophilic functional group are hydrophilic organic polymers. Examples of the hydrophilic functional groups include, a carboxyl group, a phosphoric acid group, a sulfonic acid group, an amide group, an amino group, a hydroxyl group, and a polyoxyethylene group. Further, organic polymers each having a functional group of a carboxylate group, a phosphate group, a sulfonate group, amide salts or amine salts are also hydrophilic organic polymers.

As the hydrophilic organic polymer forming the surface portion, those which are described in JP 7-1849 A, WO 98/29258, WO 00/63026, and the like can be used.

As the hydrophilic organic polymer forming the surface portion, it is preferable to use a homopolymer or a copolymer synthesized by using at least one of hydrophilic monomers (monomers having a hydrophilic group) as shown below.

Examples of the hydrophilic monomer include: (meth)acrylic acids and their alkali metal salts or amine salts; itaconic acid and its alkali metal salts or amine salts; 2-hydroxyethyl (meth)acrylate; (meth)acrylamide; N-monomethylol(meth)acrylamide; N-dimethylol(meth)acrylamide; allylamine (including its hydrohalogenic acid salt); 3-vinylpropionic acid (including its alkali metal salts or amine salts); vinylsulfonic acid (including its alkali metal salts or amine salts); 2-sulfoethyl (meth)acrylate; polyoxyethylene glycol mono(meth)acrylate; 2-acrylamide-2-methylpropanesulfonic acid; acid phosphoxypolyoxyethylene glycol mono(meth)acrylate; and allylamine (including its hydrohalogenic acid salt).

The hydrophilic organic polymer forming the above-mentioned surface portion is preferably an organic polymer containing a carboxyl group. Specifically, acrylic acid type polymers or methacrylic acid type polymers are preferable as their interaction with metal oxides is large. Poly(meth)acrylic acid homopolymers, copolymers of (meth)acrylic acid and other monomers, and partially esterified products of poly(meth)acrylic acid and their salts are included in the acrylic acid type polymers and the methacrylic acid type polymers.

By forming the surface portion of an acrylic acid type polymer or methacrylic acid type polymer cured by the metal oxide, the surface portion of a plate material becomes particularly hard.

In the case where a copolymer of a (meth)acrylic monomer and another monomer is used as the hydrophilic organic polymer forming the surface portion, a known monomer can be used as the other monomer as long as it falls within a range defined by the object of the present invention.

In this case, when hydrophilic monomers as shown below are used, the hydrophilic property of the surface portion of the plate material is particularly satisfactory. Furthermore, a copolymerization molar ratio between (meth)acrylic monomer and another monomer is preferably (meth)acrylic acid/copolymerized monomer=5/95 to 100/0, and more preferably 10/90 to 100/0.

Examples of the hydrophilic monomers include: 1. monomers each having an amide group such as acrylamide; 2.

monomers each having a carboxyl group such as methacrylic acid, itaconic acid, and 2-methacryloyloxyethylsuccinic acid; 3. monomers each having a hydroxyl group such as 2-hydroxyethyl (meth) acrylate, hydroxypropyl (meth)acrylate, hydroxybutyl (meth)acrylate, and vinyl alcohol; 4. monomers each having an oxyethylene unit such as polyethylene glycol diacrylate, polyethylene glycol monoacrylate, and methoxypolyethylene glycol methacrylate; and 5. monomers each having a sulfonic acid group such as 2-acrylamide-2-methylpropanesulfonic acid.

In the case where a copolymer is used as the hydrophilic organic polymer forming the surface portion, there is no particular limit to the sequence. Any sequence such as an alternating copolymer, a random copolymer, a block copolymer, or a graft copolymer may be used, and these sequences may be used in combination.

A molecular weight of the hydrophilic organic polymer forming the surface portion is preferably 1,000 or more and 2,000,000 or less, and more preferably 10,000 or more and 1,000,000 or less in terms of number-average molecular weight. When the molecular weight is too low, the mechanical strength of the surface portion may be insufficient. When the molecular weight is too high, the viscosity of the hydrophilic organic polymer when dissolved in a solvent is high, so that it is difficult to form the surface portion by dissolving the hydrophilic organic polymer in the solvent, followed by coating.

<Metal Oxide Forming a Surface Portion>

As the metal oxide forming the surface portion, a compound represented by "$M_xO_y$" where M is a metal atom or a metalloid atom, and x and y are real numbers or a hydrate "$M_xO_y.nH_2O$" (n is a natural number) of the compound can be used. In particular, a polyvalent metal oxide in which the valence of metal atom or metalloid atom is 2 or more is preferable because of its high ability of curing (hardening) the hydrophilic organic polymer.

As the metal oxide forming the surface portion, a peroxide, a lower oxide, and a complex oxide of the metal atom or metalloid atom can also be used. In the case of using the complex oxide, it is preferable that at least one of metal oxides forming the complex oxide is a polyvalent metal oxide.

The metal and metalloid atoms each having a valence of 2 or more include, for example, Cu, Ag, Au, Mg, Ca, Sr, Ba, Be, Zn, Cd, Al, Ti, Si, Zr, Sn, V, Bi, Sb, Cr, Mo, W, Mn, Re, Fe, Ni, Co, Ru, Rh, Pd, Os, Ir, Pt and rare earth elements.

Specific examples of the metal oxides include, silicon dioxide, aluminum oxide, titanium oxide, zirconium oxide, zinc oxide, manganese dioxide, tin oxide, titanium peroxide, magnesium oxide, molybdenum oxide, iron oxide, germanium oxide, vanadium oxide, antimony oxide and tungsten oxide. These metal oxides may be used solely or in combination with one or more different types.

Among the above-mentioned metal oxides, tin oxide is preferably used. The tin oxide has a particularly large effect of making the hydrophilic organic polymer insoluble with respect to water and making the hydrophilic organic polymer hard.

The tin oxide is a compound represented by "$Sn_kO_l$" or "$Sn_kO_l.nH_2O$" (k and l are real numbers, and n is a natural number). According to "Metal oxide and complex oxide" (Kozo Tanabe et al., Kodansha Scientific) p. 126, SnO, $SnO_2$, $Sn_3O_4$, $Sn_2O_3$, $Sn_3O_{15}$, and the like have been reported as tin oxide. In terms of availability and safety, $SnO_2$ and its hydrate $SnO_2.nH_2O$ are preferably used.

The particle size of the metal oxide forming the surface portion is preferably 1 $\mu$m or less, and more preferably 0.1 nm or more and 100 nm or less in terms of primary particle size. When the particle size of a metal oxide to be used is too large, the mechanical strength and/or water resistance of the surface portion may be insufficient.

<Additive to a Surface Portion>

In addition to the above-mentioned hydrophilic organic polymer and metal oxide, various additives can be contained in the surface portion of the present invention and a coating liquid for forming the surface portion in such a range as not to impair the effect of the present invention.

For example, in order to improve the sensitivity to laser during printing, it is possible to use a photothermal (light-heat) converting material having an absorption band matched with the wavelength of the laser. Examples of such a materials include, polymethine type coloring matters (cyanine coloring matters), phthalocyanine type coloring matters, dithiol metal complex salt type coloring matters, naphthoquinone, anthraquinone type coloring matters, triphenylmethane type coloring matters, aminium, diimmonium type coloring matters, azo type disperse dye, indoaniline metal complex coloring matters, and intermolecular CT coloring matters.

Examples of those dyes, pigments and coloring matters are described in, for example, "JOEM Handbook 2 Absorption Spectra of Dyes for Shode Lasers" by Masaru Matsuoka published by Bunshin Shuppan (1990) and "1990's Development of Functional Coloring Matters and Market Tendency" edited by CMC Editorial Department published by CMC (1990), Chapter 2, Paragraph 2.3.

Specifically, examples thereof include N-[4-[5-(4-dimethylamino-2-methylphenyl)-2,4-pentadienylidene]-3-methyl-2,5-cyclohexadien-1-ylidene]-N,N-dimethylammonium acetate, N-[4-[5-(4-dimethylaminophenyl)-3-phenyl-2-penten-4-in-1-ylidene]-2,5-cyclohexadien-1-ylidene]-N,N-dimethylammonium perchlorate, N,N-bis(4-dibutylaminophenyl)-N-[4-[N,N-bis(4-dibutylaminophenyl)amino]phenyl]-aminium hexafluoroantimonate, 5-amino-2,3-dicyano-8-(4-ethoxyphenylamino)-1,4-naphthoquinone, N'-cyano-N-(4-diethylamino-2-methylphenyl)-1,4-naphthoquinonediimine, 4,11-diamino-2-(3-methoxybutyl)-1-oxo-3-thioxopyrrolo[3,4-b]anthracene-5,10-dione, 5,16(5H,16H)-diaza-2-butylamino-10,11-dithiadinaphtho[2,3-a:2',3'-c]naphthalene-1,4-dione, bis(dichlorobenzene-1,2-dithiol)nickel(2:1) tetrabutylammonium, tetrachlorophthalocyanine aluminum chloride, and polyvinylcarbazole-2,3-dicyano-5-nitro-1,4-naphthoquinone complex.

As the photothermal conversion material, carbon black can be additionally used preferably. Carbon black absorbs light within a wide wavelength range, and can convert light energy of laser to heat energy efficiently. Thus, carbon black is particularly preferable.

Further, in order to improve the hydrophilic property, it is possible to use hydrophilic material in the surface portion. Examples of this hydrophilic material preferably used include: polyether compounds such as polyethylene glycol, and polypropylene glycol; silicon compounds such as tetraethoxysilane, and tetramethoxy silane; alkali silicates such as sodium silicate, potassium silicate, and lithium silicate; and colloidal silica.

When the above-mentioned materials are contained in the surface portion of the thermosensitive layer, a lithographic plate obtained from the plate material has a printing surface with satisfactory hydrophilic property. Therefore, an ink repelling property (property of an ink non-receiving portion of a plate of repelling oil-based ink) at the beginning of printing is enhanced. Consequently, the number of prints from the beginning of printing to a time when normal printing (where ink adheres to only an ink receiving portion of the plate, and is transferred to printed matter) can be performed is reduced.

<Process for Producing a Plate Material of the Present Invention>

The present invention also provides a process for producing a thermosensitive plate material for lithographic plate formation, in which a thermosensitive layer containing fine particles that are changed by heat to form lipophilic portions on a printing surface and an organic polymer is supported by a substrate, a surface portion that is on a surface side of the thermosensitive layer does not contain the fine particles and contains a metal oxide, a hydrophilic organic polymer is cured (hardened) by the metal oxide, and a base portion that is on a substrate side of the thermosensitive layer rather than the surface portion side contains the fine particles in an organic polymer. The process is characterized by including forming the base portion on the substrate, coating the base portion with a coating liquid containing a hydrophilic organic polymer and a metal oxide that functions as a curing (hardening) agent of the organic polymer, and drying the coating liquid, thereby forming the surface portion.

According to the process of the present invention, by setting the coating thickness of the coating liquid so that the thickness of the surface portion becomes 0.1 μm or more after drying, the plate material of the present invention can be obtained.

Another process for obtaining the plate material of the present invention will be described below. According to this process, first, a substrate is coated with a coating liquid containing a hydrophilic organic polymer, a metal oxide that functions as a curing (hardening) agent of the organic polymer, and lipophilic portion forming particles. Then, the lipophilic portion forming particles in a coating film are moved to the substrate side to form a portion in which the particles are not present to a thickness of 0.1 μm or more on a surface side of the coating film, and the coating film is dried in this state.

Examples of the method for moving the particles include (1) method for applying an electric field by charging the particles, (2) method for applying a magnetic field by magnetizing the particles, (3) method for using particles having a specific gravity higher than that of the coating liquid, and precipitating the particles by gravity, and (4) method for fixing the substrate on an inner side of a cylinder, and rotating the cylinder at a high speed, thereby precipitating the particles by a centrifugal force.

Still another process for obtaining the plate material of the present invention will be described below. According to this process, first, as a coating liquid for forming a surface portion, a first coating liquid is prepared, which contains a hydrophilic organic polymer, a metal oxide that functions as a curing agent of the organic polymer, and a first solvent. Furthermore, as a coating liquid for forming a base portion, a second coating liquid containing an organic polymer, lipophilic portion forming particles, and a second solvent is prepared.

As the first solvent, a solvent is used, which dissolves the polymer and the metal oxide contained in the first coating liquid, does not disperse the lipophilic portion forming particles, and does not dissolve the polymer contained in the second coating liquid. As the second solvent, a solvent is used, which is not compatible with the first solvent, does not dissolve the polymer and the metal oxide contained in the first coating liquid, dissolves the polymer contained in the second coating liquid, disperses the lipophilic portion forming particles, and has a specific gravity higher than that of the first solvent.

Then, a mixture of the first coating liquid and the second coating liquid is applied to a substrate placed horizontally and allowed to stand. As a result, the coating film made of the mixture is separated into a coating film made of the first coating liquid and a coating film made of the second coating liquid, and the former having a lower specific gravity is on the surface side, and the latter having a higher specific gravity is on the substrate side. Then, these coating films are dried. Consequently, a base portion and a surface portion are formed simultaneously on the substrate.

<Coating Liquid>

As described above, the metal oxide cures a hydrophilic organic polymer. Therefore, when this curing reaction occurs in the coating liquid, the coating liquid undergoes precipitation or is gelated. Consequently, a uniform coating film may not be obtained. Furthermore, the viscosity of the coating liquid may be increased due to the long-term storage.

Thus, in the coating liquid forming the surface portion, it is preferable that a metal oxide and a hydrophilic organic polymer are present in a state of being inactive to each other. Examples of the method of obtaining the inactive state include a method of using a metal oxide in an inactive state with respect to a hydrophilic organic polymer by a stabilizer, and a method of neutralizing a hydrophilic organic polymer with a base.

As the stabilizer, an acid or a base can be used. The acids usable as the stabilizer may be any acid of an organic acid and an inorganic acid. Typical examples of the acids include acetic acid and hydrochloric acid.

Examples of bases usable as the stabilizer and a neutralizer of a hydrophilic organic polymer include hydroxides of an alkaline metal element or an alkaline earth metal element (sodium hydroxide, potassium hydroxide, lithium hydroxide, calcium hydroxide, etc.), amine compounds (chain amine, cyclic amine, aromatic amine, aliphatic amine, polyamine, etc.), and ammonia. Examples of preferable bases as the stabilizer include monoethanol amine, diethanol amine, triethanol amine, ethyl amine, diethyl amine, triethyl amine, methyl amine, dimethyl amine, trimethyl amine, and ammonia.

As the stabilizer and neutralizer, a base having a boiling point lower than that of the solvent contained in the coating liquid is preferably used. Because of this, the stabilizer is removed with the solvent during drying after coating of the coating liquid, so that the stabilizer does not remain on a plate material. In this respect, ammonia is preferably used as the stabilizer.

In the case of using a metal oxide sol (dispersion liquid in which particles of a metal oxide are dispersed in a liquid) for preparing the coating liquid, it is preferable to use a metal oxide sol from which an impurity has been removed with ion exchange resin, in particular, anion exchange resin.

Furthermore, the above-mentioned various kinds of additives and a surfactant for making the surface portion uniform may be added to the coating liquid.

As a method for forming the surface portion using the coating liquid, a conventionally known technique can be adopted. Specifically, a coating liquid is applied by a method such as bar coating, roller coating, die coating, blade coating, dip coating, doctor knife, spray coating, flow coating, and brush coating, and thereafter, a solvent is dried. When the solvent is dried, the solvent may be heated or dried under reduced pressure, if required. A so-called post-cure operation may be performed, in which the solvent is additionally heated after completion of drying.

<Plate Material in Which a Surface Portion of a Thermosensitive Layer is Porous>

In the plate material of the present invention, it is preferable that the surface portion of the thermosensitive layer is porous.

According to the present invention, in the surface portion, a hydrophilic organic polymer is cured by a metal oxide. Therefore, in the case where the surface portion is porous, its porous configuration is formed by a hydrophilic organic polymer cured by a metal oxide. Such a porous configuration has higher elasticity, compared with that of an inorganic porous configuration formed by the aggregation of particles made of a metal oxide. Therefore, a lithographic plate obtained from a plate material of the present invention in which the surface portion of the thermosensitive layer has the above-mentioned porous configuration is unlikely to be broken during printing.

In printing using a lithographic plate, oil-based ink is allowed to adhere to the surface of the lithographic plate under the condition that the surface portion of the lithographic plate contains water. Therefore, in the case where the surface portion of the thermosensitive layer is porous, the water-retention capacity of the surface portion of the lithographic plate obtained by subjecting the plate material to plate-making is high. Therefore, the hydrophilic property of an ink non-receiving portion (hydrophilic portion) of the lithographic plate is satisfactorily retained, and a non-image portion of printed matter is unlikely to be contaminated.

Furthermore, when the surface portion of the thermosensitive layer is porous, compared with a plate material having a non-porous surface portion with the same thickness, lipophilic portion forming particles (lipophilic component exuding out of micro-capsules, in the case where the lipophilic portion forming particles are micro-capsules) melted in a base portion during heating for plate-making are likely to be exposed to the surface through pores. Therefore, the sensitivity of the thermosensitive layer can be enhanced while the surface portion is set to be thick.

The size of fine pores of the porous surface portion is preferably 1 nm or more and 100 $\mu$m or less in terms of an average diameter, and more preferably 10 nm or more and 10 $\mu$m or less. When the fine pore size is too small, water is unlikely to permeate the surface portion of a lithographic plate obtained from the plate material, so that the above-mentioned effect of enhancement of the water-retention capacity is not sufficient. Furthermore, when the fine pore size is too large, the resolution of a printed image may be degraded during printing using a lithographic plate obtained from the plate material.

A preferable method for forming the surface portion of the thermosensitive layer into a porous configuration will be described below.

First, a base portion is formed on a substrate by using a coating liquid for forming a base portion. As a coating liquid for forming a surface portion, a coating liquid containing a metal oxide stabilized with ammonia and a hydrophilic organic polymer neutralized with ammonia is prepared. Then, the base portion is coated with the coating liquid. Then, the coating film is dried under the condition that phase separation occurs, and a solvent and ammonia are removed from the coating film.

The surface portion obtained by the above method is made of a hydrophilic organic polymer cross-linked by a metal oxide, and furthermore, has a mesh-shaped porous configuration of an open cell type, as shown in FIG. 3. Therefore, a lithographic plate obtained by subjecting a plate material having this surface portion to plate-making has particularly high water-retention capacity and mechanical strength in the surface portion. Furthermore, the method includes only simple processes of coating of a liquid and drying of a coating film, so that a porous surface portion can be formed easily.

<Configuration of a Base Portion>

A base portion that is a substrate side portion of a thermosensitive layer rather than the surface portion in the plate material of the present invention contains an organic polymer and lipophilic portion forming particles.

The base portion corresponds to a conventional thermosensitive layer (e.g., hydrophilic layer described in JP 7-1849 A, recording layer described in WO 98/29258, and thermosensitive layer described in WO 00/63026), so that the base portion can be formed by a conventional method for forming a thermosensitive layer or the same method as that described in these publications.

An organic polymer forming the base portion may be a polymer made of an organic compound, and is preferably a hydrophilic organic polymer similarly to the organic polymer forming the surface portion.

The hydrophilic organic polymer that can be used for the base portion is the same as that for the surface portion, and a preferable material and the like are also the same as those for the surface portion. The base portion and the surface portion may be composed of the same hydrophilic organic polymer. In this case, the boundary between the base portion and the surface portion is unclear, which causes no particularly serious problem.

Furthermore, the organic polymer forming the base portion is preferably cured by a cross-linking method or a curing method described in JP 7-1849 A, WO 98/29258, or WO 00/63026. For example, as described in WO 00/63026, a hydrophilic organic polymer having Lewis base moieties is used as the organic polymer forming the base portion, and this polymer is cured by a polyvalent metal oxide, whereby printing resistance can be enhanced.

The polyvalent metal oxide that can be used in this case is illustrated in the above section of the surface portion. Among them, it is preferable to use silicon dioxide, aluminum oxide, tin oxide, titanium peroxide, or titanium oxide.

<Lipophilic Portion Forming Particles>

Examples of lipophilic portion forming particles (fine particles that are changed by heat to form a lipophilic portion on a printing surface) include fine particles composed of the following materials and micro-capsules containing a lipophilic component. Examples of the materials include (1) thermoplastic resin such as polyethylene resin, polystyrene, polypropylene, polyvinyl chloride type resin, polyamide type resin, and thermoplastic polyurethane, (2) animal and plant wax, and (3) oil wax.

The plate material of the present invention is formed into a plate by applying heat to a portion of a thermosensitive layer to be an ink receiving portion of the plate. At this time, lipophilic portion forming particles in the base portion are changed by heat reaching the base portion through the surface portion or heat converted from light such as a laser by a photothermal conversion material, and the particles are mixed in the surface portion or an organic polymer present on the surface side from the particles is removed, whereby a lipophilic portion (ink receiving portion) is formed on the printing surface.

In the case where the lipophilic portion forming particles are fine particles other than micro-capsules, a plurality of fine particles are fused by heat, whereby a lipophilic portion is formed on the printing surface. In the case where the lipophilic portion forming particles are micro-capsules containing a lipophilic component (component forming a lipophilic portion), the lipophilic component exudes out of micro-capsules due to heat, whereby a lipophilic portion is formed on the printing surface. In particular, in the case where a liquid lipophilic component is present as a core material in capsule films of the micro-capsules, the capsule films are fractured by heat, and the lipophilic component exudes out of the capsules, whereby the lipophilic portion is formed on the printing surface.

When the micro-capsules containing the lipophilic component are used as the lipophilic portion forming particles, compared with the case of using fine particles other than micro-capsules, heat energy required for plate-making can be reduced. Therefore, it is preferable that the micro-capsules containing the hydrophilic component are used as the hydrophilic portion forming particles. Furthermore, by using the micro-capsules, a threshold value can be set with respect to energy during plate-making.

Regarding the particle size of the lipophilic portion forming particles, the particles with an average particle size of 10 μm or less are preferably used, and particles having an average particle size of 5 μm or less are preferably used for the purpose of obtaining a high resolution. It is preferable that the particle size of the lipophilic portion forming particles is as small as possible. However, in view of the handling of the particles, it is preferable to use particles with an average particle size of 0.01 μm or more.

Furthermore, in the case of micro-capsules in which the lipophilic portion forming particles contain the lipophilic component, it is preferable that the lipophilic component has a reactive functional group. Because of this, the lipophilic portion of the lithographic plate obtained by plate-making has high printing resistance.

Examples of the reactive functional group include, a hydroxyl group, a carboxyl group, an amino group, an allyl group, a vinyl group, a methacryloyl group, an acryloyl group, a thiol group, an epoxy group, and an isocyanate group.

In the case where the lipophilic portion forming particles are micro-capsules containing a lipophilic component, the capsule films of the micro-capsules may contain, as a core material, a dye, a photothermal conversion material, a polymerization initiator, a polymerization inhibitor, a catalyst, and other various kinds of additives, in such a range as not to impair the effect of the present invention, in addition to the above-mentioned lipophilic components.

In particular, when the dye and/or the photothermal conversion material is added, a laser can be used as a heat source during plate-making, which is preferable. By producing a plate using the laser, image representation with a higher definition can be performed. These additives are also described in WO 98/29258 and the like.

<Additive to a Base Portion>

The base portion may contain additives such as a sensitizer, a photothermal conversion material, a thermal disrupting agent, a color developer, a reactive material, a hydrophilic modifier, a molten material absorber, a lubricant, and a surfactant as described in WO 98/29258, in such a range as not to depart from the object of the present invention. For the reason stated in the section of the additives to the surface portion, it is preferable to use carbon black as the photothermal conversion material. These additives may be contained in the lipophilic portion forming particles, and may be contained in an organic polymer in which the particles are dispersed.

<Substrate>

A material for the substrate for supporting the thermosensitive layer in the plate material of the present invention is selected from known materials in view of the performance and cost required in the printing field.

In the case where high size precision is required in a plate material as in multi-color printing, and in the case where the substrate is used in a printer in which a mechanism for mounting a plate material on a plate body is dedicated to a metal support, a substrate made of metal such as aluminum and steel is preferably used. In the case where high printing resistance is required instead of multi-color printing, a substrate made of plastic such as polyester can be used.

Furthermore, in the field requiring a low cost, a substrate made of natural paper or synthetic paper, a substrate in which the natural paper or synthetic paper is laminated with waterproof resin, or a substrate made of coated paper can be used. Furthermore, a substrate with a complex configuration, in which an aluminum thin film is formed on the surface of paper or a plastic sheet by vapor deposition or lamination, can also be used.

In order to enhance the adhesion between the substrate and the thermosensitive layer, a substrate subjected to surface treatment may be used. Examples of the method for surface treatment in the case where the substrate is the plastic sheet include corona discharge treatment and blast treatment. It is preferable that a substrate made of aluminum is subjected to degreasing/surface roughening, degreasing/electropolishing/anodic oxidation, and the like by using a method described in known documents such as "Surface Treatment of Aluminum" by Sadajiro Kokubo (1975, Uchida Rokakuho Shinsha), "Plate-making Printing Technology of PS Plate" by Yoshio Daimon (1976, Nippon Insatsu), "Introduction to PS Plate" by Teruhiko Yonezawa (1993, Insatsu Gakkai Shuppanbu), and the like.

An adhesive layer may be formed on the substrate, and a thermosensitive layer may be formed on the adhesive layer, if required. As the material used in the adhesive layer, silane coupling agents such as γ-aminopropy-triethoxysilane and γ-glycidoxypropyltrimethoxysilane, and acrylic, urethane, cellulose, epoxy, or allylamine adhesives described in "Cyclopedia of Adhesion and Sticking" edited by Shozaburo Yamada, published by Asakura Shoten (1986), "Handbook of Adhesion" edited by Nippon Secchaku Kyokai, published by Nihon Kogyo Shinbunsha (1980), and the like can be used.

Furthermore, the plate material of the present invention may be designed in such a manner that the thermosensitive layer (base portion and surface portion) is formed directly on the plate body of the printer, instead of that the thermosensitive layer is supported by a plate-shaped substrate. In this case, the plate body of the printer corresponds to the substrate. Furthermore, a thermosensitive layer may be formed on a cylinder called a sleeve to be mounted on the plate body of the printer. In this case, the cylinder corresponds to the substrate.

<Lithographic Plate of the Present Invention>

The present invention also provides a lithographic plate obtained by using a plate material of the present invention or a plate material produced by the process of the present invention, and changing the lipophilic portion forming particles by heat to form a lipophilic portion on a printing surface.

BEST MODE FOR CARRYING OUT THE INVENTION

Figure 1:
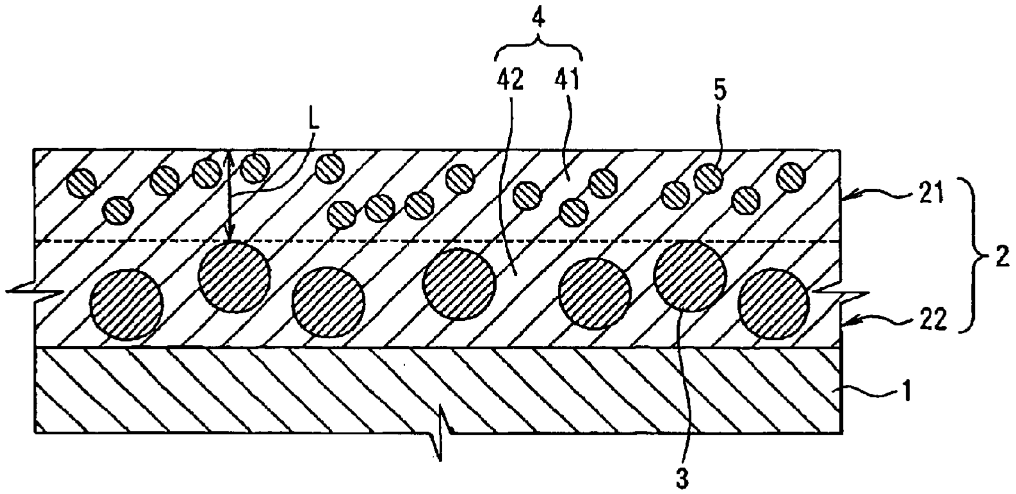
FIG. 1 is a cross-sectional view showing a thermosensitive plate material for lithographic plate formation of the present invention.
Figure 2:
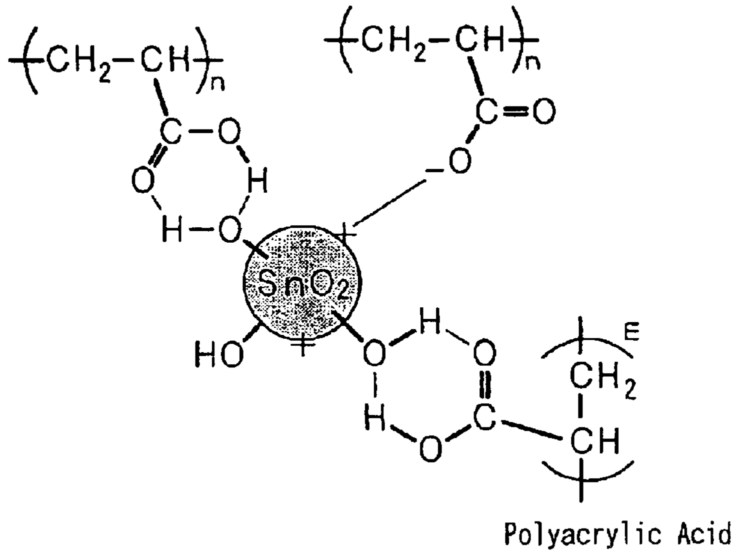
FIG. 2 illustrates a state where a hydrophilic organic polymer in a surface portion is cured by a metal oxide in the thermosensitive plate material for lithographic plate formation of the present invention.

Hereinafter, an embodiment of the present invention will be described using specific examples and comparative examples.

<Production of a Plate Material (No. 1)>

(1) Production of Micro-Capsules Containing a Lipophilic Component (Component Forming a Lipophilic Portion on a Printing Surface with Heat)

First, 4.24 g of an adduct (trade name: Colonate L, a substance containing 25% by mass of ethyl acetate, produced by Nippon Polyurethane Industry Co., Ltd.) in which tolylenediisocyanate and trimethylolpropane are added in a ratio of 3:1 (molar ratio) as a material for forming micro-capsule walls, 1.12 g of trimethylolpropane triacrylate (produced by Kyoeisha Chemical Co., Ltd.), and 0.93 g of a near-infrared absorbing dye ("KayasorbIR-820B" produced by Nippon Kayaku Co., Ltd.) were dissolved uniformly in 21.7 g of glycidyl methacrylate to prepare an oil component.

Then, 3.6 g of propylene glycol alginate ("DUCK LOID LF", produced by Kibun Food Chemifa Co., Ltd., number average molecular weight: $2\times10^5$) as a protection colloid and 2.91 g of polyethylene glycol ("PEG 400", produced by Sanyo Chemical Industries, Ltd.) as a material for forming micro-capsule walls were dissolved in 116.4 g of purified water to prepare an aqueous phase.

Then, the above-mentioned oil component and the aqueous phase were mixed at room temperature at a rotation speed of 6000 rpm by using a homogenizer to be emulsified. Then, the emulsified dispersion liquid was moved under the condition of being placed in a container to a water bath heated to 60° C., and stirred at a rotation speed of 500 rpm for 3 hours. Because of this, dispersion liquid in which micro-capsules (MC-A) with an average particle size of 2 μm were dispersed was obtained.

The micro-capsules (MC-A) contain glycidylmethacrylate and trimethylolpropane triacrylate as lipophilic components (lipophilic portion forming components) and the near-infrared absorbing dye as a dye inside capsule films. The particle size of the micro-capsules was measured by using a particle size distribution measurement unit (HORIBA LA910) produced by Horiba Seisakusho.

Then, in a purifying process, the resultant micro-capsule dispersion liquid was centrifuged to remove components contained in the dispersion liquid other than the micro-capsules (e.g., oil components that were not taken in the micro-capsules, a residue of a material for forming micro-capsule walls, a protection colloid, etc.), followed by washing with water three times. The concentration of the micro-capsules in the micro-capsule dispersion liquid obtained after purification was 3.5% by mass.

(2) Preparation of a Coating Liquid for Forming a Base Portion

As a polyacrylic acid aqueous solution, "AC10H", trade name, produced by Nihon Junyaku Co., Ltd., having a number average molecular weight of about 200,000 and the concentration of polyacrylic acid of 20% by mass was prepared. Then, 7.5 parts by weight of polyacrylic acid aqueous solution, 1.87 parts by weight of ammonia water (produced by Kanto Kagaku Co., Ltd.) with a concentration of 25% by mass, and 20.63 parts by weight of purified water were added into a container, and stirred at a rotation speed of 250 rpm for 2 hours at room temperature to prepare an aqueous solution of polyacrylic acid ammonium salt (BP-1).

Then, 8.75 g of BP-1 and 80 g of MC-A obtained in the above (1) were added into a container. While the content (liquid) in the container was being stirred at a rotation speed of 250 rpm, 1.52 g of a carbon black dispersion liquid (trade name: "PSM-Black C", produced by Mikuni Color, Ltd.) was slowly dropped into the liquid, and thereafter, the resultant mixture was additionally stirred for one hour. After one hour has passed, stirring was temporarily stopped. Then, 16 g of tin oxide sol (trade name "EPS-6" that is a liquid in which tin oxide particles (average particle size: 5 nm) were dispersed in water in a concentration of 6% by mass and stabilized with ammonia, produced by Yamanaka Chemical Co., Ltd.) in a concentration of 6% by mass was added to the liquid, and the resultant mixture was additionally stirred for one hour. As a result, a coating liquid (BC-1) for forming a base portion was obtained.

(3) Preparation of a Coating Liquid for Forming a Surface Portion

First, the above-mentioned tin oxide sol was purified with anion-exchange resin to remove an impurity. As a result of the purification, the concentration of tin oxide sol became 7% by mass.

Then, 13 g of BP-1 obtained in the above (2), 2 g of polyethylene glycol ("PEG#400", produced by Sanyo Chemical Industries, Ltd.) that is a hydrophilicity imparting agent and 45.6 g of purified water were added into a container. While the content (liquid) in the container was being stirred at a rotation speed of 250 rpm, 0.56 g of the above-mentioned carbon black dispersion liquid was slowly dropped, and the resultant mixture was additionally stirred for one hour. After one hour has passed, stirring was temporarily stopped. Then, 18.5 g of the above-mentioned tin oxide sol in a concentration of 7% by mass was added to the mixture, followed by stirring for one hour additionally. As a result, a coating liquid (OC-1) for forming a surface portion was obtained.

(4) Formation of a Thermosensitive Layer

As a substrate, an aluminum plate (324 mm×492 mm) with a thickness of 0.3 mm subjected to anodic oxidation was prepared. The printing surface of the substrate was coated with the coating liquid BC-1 with a bar coater (Rod No. 24) to form a coating film. The substrate with the coating film formed thereon was placed in an oven, and a solvent and ammonia (neutralizer of a hydrophilic organic polymer) were evaporated from the coating film at 140° C. for 2 minutes under the windless condition. As a result, a base portion was formed on the substrate.

The base portion was coated with the coating liquid OC-1 with a bar coater (Rod No. 16) to form a coating film. The substrate with this coating film formed thereon was placed in an oven, and the solvent and ammonia (neutralizer of a hydrophilic organic polymer and a stabilizer of tin oxide) were evaporated from the coating film at 140° C. for 2 minutes under the windless condition. As a result, a surface portion was formed on the base portion.

<Production of a Plate Material (No. 2)>

(1) Synthesis of a Hydrophilic Organic Polymer

First, 248.5 g of acrylic acid and 2000 g of toluene were added into a separable flask. While the content in the flask was being stirred at room temperature, a toluene solution of azobisisobutyronitrile (hereinafter, abbreviated as "AIBN") prepared separately was gradually dropped into the flask.

This toluene solution was obtained by dissolving 2.49 g of AIBN in 24.9 g of toluene, and this solution was thoroughly added to the flask.

Next, the content in the flask was heated to 60° C. and stirred for 3 hours. A polymer generated and precipitated was filtered, and the solid content after the filtration was washed with about 2 liters of toluene. Then, the washed polymer was temporarily dried at 80° C., and further dried in vacuum until a constant mass was obtained. As a result, 235 g of a primary polymer was obtained. Then, 355 g of distilled water was added into a new separable flask, 35.5 g of the primary polymer was added into the flask, and the primary polymer was dissolved in water.

Then, a liquid containing 2.84 g of glycidyl methacrylate, 0.1 g of 2,6-di-t-butyl-p-cresol (hereinafter, abbreviated as "BHT"), and 1 g of triethylbenzylammonium chloride was added into the flask from a dropping funnel over 30 minutes. This addition was performed while dry air was circulating in the flask and the content in the flask was being stirred. After the completion of the addition, the content in the flask was gradually heated while the content of the flask was being stirred. As a result, a predetermined acid value was obtained when the content was stirred at 80° C. for one hour.

The content (polymer) in the flask was cooled at this time, and the polymer was isolated in acetone. Thereafter, the polymer was washed with acetone by rubbing. Then, the polymer was dried in vacuum at room temperature. As a result, polyacrylic acid denatured with glycidyl methacrylate was obtained.

This polymer was analyzed by an NMR method to reveal that a glycidyl methacrylate introduction ratio was 2.2%. Furthermore, when the molecular weight of the polymer was measured by GPC to reveal that the number average molecular weight of the polymer was $6\times10^4$.

(2) Preparation of a Coating Liquid for Forming a Surface Portion

An aqueous solution containing the polymer obtained in the above (1) in a concentration of 20% by mass was prepared. Then, 7.5 parts by weight of this aqueous solution, 1.87 parts by weight of an ammonia aqueous solution (same as the above) in a concentration of 25% by mass, and 20.63 parts by weight of purified water were added into a container, and the mixture was stirred at a rotation speed of 250 rpm at room temperature for 2 hours, whereby an aqueous solution (BP-2) of an ammonium salt of the above-mentioned polymer was prepared.

Then, 13 g of BP-2, 2 g of polyethylene glycol (same as the above) that is a hydrophilicity imparting agent, 0.6 g of tetraethoxy silane that is a hydrophilicity imparting agent, and 45 g of purified water were added into a container. While the content (liquid) in the container was being stirred at a rotation speed of 250 rpm, 0.56 g of carbon black dispersion liquid (same as the above) was slowly dropped into the container. Thereafter, the resultant content was additionally stirred for one hour. After one hour has passed, stirring was temporarily stopped, and 18.5 g of tin oxide sol (same as that for forming a surface portion in No. 1) was added. Then, the resultant mixture was additionally stirred for one hour. As a result, a coating liquid (OC-2) for forming a surface portion was obtained.

(3) Formation of a Thermosensitive Layer

A surface portion was formed by the same method as that in No. 1, except that a base portion was formed on a substrate by the same method as that in No. 1, using the same coating liquid BC-1 and substrate as those in No. 1, and thereafter, the coating liquid OC-2 was applied onto the base portion.

<Production of a Plate Material (No. 3)>

(1) Synthesis of a Hydrophilic Organic Polymer

The air in a separable flask was replaced with nitrogen. Thereafter, 19 g of acrylic acid, 1 g of methyl methacrylate, and 380 g of water were added into the flask. Then, while the content in the flask was being stirred at room temperature, 0.1 g of "VA044" (produced by Wako Pure Chemical Industries, Ltd.) was added to the flask as a reaction initiator. Then, the content in the flask was heated to 60° C., and stirred for 3 hours. Thereafter, a GPC measurement was conducted. As a result, the reaction was confirmed to be completed.

Accordingly, an acrylic acid-methacrylic acid copolymer was obtained in an aqueous solution form. The number average molecular weight of the copolymer was measured by GPC to be about 900,000. Furthermore, the concentration of the copolymer in the aqueous solution (BP-3) was 5% by mass.

(2) Preparation of a Coating Liquid for Forming a Surface Portion

Then, 13 g of BP-3 obtained in the above (1), 2 g of polyethylene glycol (same as the above) that is a hydrophilicity imparting agent, and 45 g of purified water were added into a container. While the content (liquid) in the container was being stirred at a rotation speed of 250 rpm, 0.56 g of carbon black dispersion liquid (same as the above) was slowly dropped to the container. Thereafter, the resultant content was additionally stirred for one hour. After one hour has passed, stirring was temporarily stopped, and 18.5 g of tin oxide sol (same as that for forming a surface portion in No. 1) and 0.48 g of lithium silicate ("Lithium Silicate 35", produced by Nippon Chemical Industries, Ltd.) were added. Then, the resultant mixture was additionally stirred for one hour. As a result, a coating liquid (OC-3) for forming a surface portion was obtained.

(3) Formation of a Thermosensitive Layer

A surface portion was formed by the same method as that in No. 1, except that a base portion was formed on a substrate by the same method as that in No. 1, using the same coating liquid BC-1 and substrate as those in No. 1, and thereafter, the coating liquid OC-3 was applied onto the base portion.

<Production of a Plate Material (No. 4)>

(1) Synthesis of a Hydrophilic Organic Polymer

The air in a separable flask was replaced with nitrogen. Thereafter, 15 g of acrylic acid, 5 g of acrylamide, and 380 g of water were added in the flask. Then, while the content in the flask was being stirred at room temperature, 0.1 g of "VA044" (same as the above) was added to the flask as a reaction initiator. Then, the content in the flask was heated to 60° C., and stirred for 3 hours. Thereafter, a GPC measurement was conducted. As a result, the reaction was confirmed to be completed.

Accordingly, an acrylic acid-acrylamide copolymer was obtained in an aqueous solution form. The number average molecular weight of the copolymer was measured by GPC to be about 800,000. Furthermore, the concentration of the copolymer in the aqueous solution was 5% by mass.

(2) Preparation of a Coating Liquid for Forming a Surface Portion

First, 13 g of the copolymer aqueous solution obtained in the above (1) and 2 g of polyethylene glycol (same as the above) that is a hydrophilicity imparting agent were mixed in a container, and an aqueous solution, in which 0.48 g of sodium silicate ($SiO_2/Na_2O$=2.06 to 2.31; concentration of a solid content: 52 to 57% by mass; produced by Wako Pure Chemical Industries, Ltd.) was dissolved in 45 g of purified water, was added to the container.

While the liquid in the container was being stirred at a rotation speed of 250 rpm, 0.56 g of carbon black dispersion liquid (same as the above) was slowly dropped to the container. Thereafter, the resultant content was additionally stirred for one hour. After one hour has passed, stirring was temporarily stopped, and 18.5 g of tin oxide sol (same as that for forming a surface portion in No. 1) was added. Then, the resultant mixture was additionally stirred for one hour. As a result, a coating liquid (OC-4) for forming a surface portion was obtained.

(3) Formation of a Thermosensitive Layer

A surface portion was formed by the same method as that in No. 1, except that a base portion was formed on a substrate by the same method as that in No. 1, using the same coating liquid BC-1 and substrate as those in No. 1, and thereafter, the coating liquid OC-4 was applied onto the base portion.

<Production of a Plate Material (No. 5)>

(1) Preparation of a Coating Liquid for Forming a Surface Portion

First, 13 g of the aqueous solution of polyacrylic acid ammonium salt obtained in (2) of No. 1, 2 g of polyethylene glycol (same as the above) that is a hydrophilicity imparting agent, and 60 g of purified water were added into a container. While the content in the container was being stirred at a rotation speed of 250 rpm, 0.56 g of a carbon black dispersion liquid (same as the above) was slowly dropped to the content, and the resultant content was additionally stirred for one hour.

After one hour has passed, stirring was temporarily stopped. Then, 4.3 g of a water dispersion liquid (colloidal silica "Snowtex-S", in which silica dioxide is stabilized with a stabilizer, produced by Nissan Chemical Industries, Ltd.) containing 30% by mass of silica dioxide particles was added to the content, and the resultant content was additionally stirred for one hour. As a result, a coating liquid (OC-5) for forming a surface portion was obtained.

(2) Formation of a Thermosensitive Layer

A surface portion was formed by the same method as that in No. 1, except that a base portion was formed on a substrate by the same method as that in No. 1, using the same coating liquid BC-1 and substrate as those in No. 1, and thereafter, the coating liquid OC-5 was applied onto the base portion.

<Production of a Plate Material (No. 6)>

(1) Preparation of a Coating Liquid for Forming a Surface Portion

First, 13 g of the aqueous solution of polyacrylic acid ammonium salt obtained in (2) of No. 1, 2 g of polyethylene glycol (same as the above) that is a hydrophilicity imparting agent, and 42.5 g of purified water were added into a container. While the content in the container was being stirred at a rotation speed of 250 rpm, 0.56 g of a carbon black dispersion liquid (same as the above) was slowly dropped to the content, and the resultant content was additionally stirred for one hour.

After one hour has passed, stirring was temporarily stopped. Then, 21.6 g of a water dispersion liquid ("TINOC M-6", in which titanium oxide is stabilized with a stabilizer, produced by Taki Chemical Co., Ltd.) containing 6% by mass of titanium oxide was added to the content, and the resultant content was additionally stirred for one hour. As a result, a coating liquid (OC-6) for forming a surface portion was obtained.

(3) Formation of a Thermosensitive Layer

A surface portion was formed by the same method as that in No. 1, except that a base portion was formed on a substrate by the same method as that in No. 1, using the same coating liquid BC-1 and substrate as those in No. 1, and thereafter, the coating liquid OC-6 was applied onto the base portion.

<Production of a Plate Material (No. 7)>

First, using the same coating liquid BC-1 and substrate as those in No. 1, a coating film of the coating liquid BC-1 was formed on the substrate by the same method as that in No. 1. Then, the substrate with the coating film formed thereon was placed in an oven, and hot air was applied to the coating film surface at 140° C. and a wind speed of 2 m/sec. for 2 minutes, whereby a solvent and ammonia (neutralizer of an hydrophilic organic polymer) were evaporated from the coating film. As a result, a base portion was formed on the substrate.

Next, a coating film of the same coating liquid OC-1 as that in No. 1 was formed on the base portion by the same method as that in No. 1. Then, the substrate with the coating film formed thereon was placed in an oven, and hot air was applied to the coating film surface at 140° C. and a wind speed of 2 m/sec. for 2 minutes, whereby a solvent and ammonia (neutralizer of an hydrophilic organic polymer) were evaporated from the coating film. As a result, a surface portion was formed on the base portion.

<Production of a Plate Material (No. 8)>

A base portion was formed on the substrate by the same method as that in No. 1, except that a surface portion was not formed on the base portion, by the same method as that in No. 1, using the same coating liquid BC-1 and substrate as those in No. 1.

<Production of a Plate Material (No. 9)>

First, 8.75 g of the aqueous solution of polyacrylic acid ammonium salt obtained in (2) of No. 0.1 (BP-1) and, 80 g of micro-capsule water dispersion liquid (micro-capsule concentration of 3.5% by mass) that is obtained in (1) of No.1, were added in a container. While the content (liquid) in the container was being stirred at a rotation speed of 250 rpm, 1.52 g of the carbon black dispersion liquid (same as the above) was slowly dropped to the liquid, and then the resultant content was additionally stirred for one hour. After one hour has passed, the stirring was temporarily stopped. Then, to the liquid, 0.79 g of silicon dioxide ("AEROSOL 200" produced by Japan Aerosol Inc.) was added, followed by stirring for one hour additionally.

The printing surface of the same substrate as that in No. 1 was coated with the above-mentioned liquid by a bar coater (Rod No. 24) to form a coating film. The substrate with the coating film formed thereon was placed in an oven, and a solvent and ammonia (neutralizer of a hydrophilic organic polymer) were evaporated from the coating film at 140° C. for 2 minutes under the windless condition. As a result, a base portion was formed on the substrate. A surface portion was not formed on the base portion.

<Production of a Plate Material (No. 10)>

(1) Preparation of a Coating Liquid for Forming a Surface Portion 13 g of BP-1 obtained in (2) of No.1, 2 g of polyethylene glycol ("PEG#400", produced by Sanyo Chemical Industries, Ltd.) that is a hydrophilicity imparting agent and 45.6 g of purified water were added into a container. While the content (liquid) in the container was being stirred at a rotation speed of 250 rpm, 0.56 g of the above-mentioned carbon black dispersion liquid was slowly dropped, and the resultant mixture was additionally stirred for one hour. As a result, a coating liquid (OC-10) for forming a surface portion was obtained.

(2) Formation of a Thermosensitive Layer

First, the base portion was formed on a substrate by the same method as that in No. 1, using the same coating liquid BC-1 and substrate as those in No. 1. Thereafter, a surface portion was formed by the same method as that in No. 1, except that the coating liquid OC-10 obtained in (1) was applied onto the base portion.

<State of a Plate Material>

Figure 3:
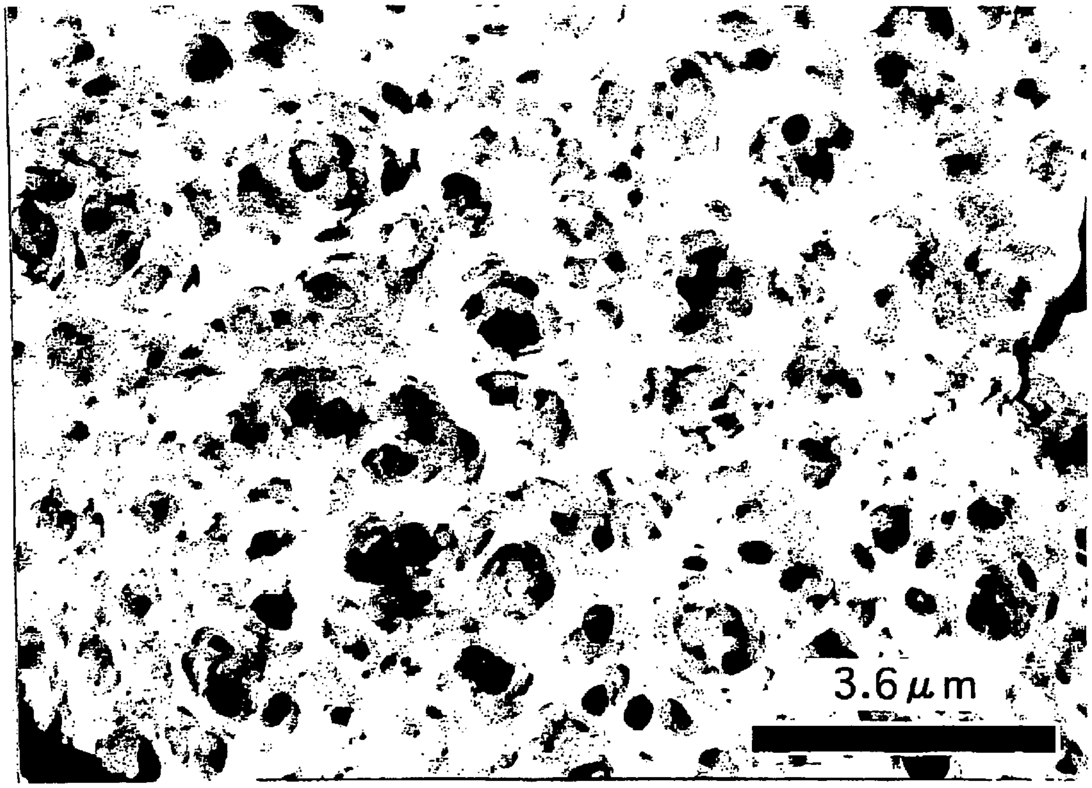
FIG. 3 is an enlarged view (electron micrograph) showing a porous configuration of a surface portion in the thermosensitive plate material for lithographic plate formation of the present invention.

Regarding each plate material thus obtained, the surface of a thermosensitive layer was magnified and observed with a scanning electron microscope. In the plate material No. 1, an enlarged photograph shown in FIG. 3 was obtained. As shown in this figure, the surface portion of the plate material had a mesh-shaped porous configuration of an open cell type. The surface portions of the plate materials Nos. 2 to 6 also had the porous configuration similar to that of No. 1.

In Nos. 7, 8, and 10, a porous configuration was not observed. Furthermore, in No. 9, a porous configuration ascribed to a three-dimensional mesh configuration of silicon dioxide was observed.

Furthermore, the thickness of the surface portion of each plate material was measured as follows. First, a carbon vapor-deposited film and a polymer protective film were formed on the surface of each plate material. Then, the plate material was cut so that the surface of a thermosensitive layer was about 200 μm×2 mm. Then, a small chip thus cut was fixed on the mesh, and machined with FIB (focused ion beam machining device) to obtain a sample for cross-section TEM (transmission electron microscope) observation.

This sample was attached to TEM (Hitachi HF-2000), and the cross-section of the thermosensitive layer was photographed at 20000-magnification. The captured image was enlarged fourfold to obtain an 80000-fold positive image. By using this positive image, a distance L (shown in FIG. 1) from the surface of the thermosensitive layer to the microcapsule (lipophilic portion forming particle) placed closest to the surface was measured as the thickness of the surface portion. Ten samples for TEM observation were produced from the same plate material, and an average value thereof was adopted.

As a result, the thickness of the surface portion of each plate was as follows: 0.4 μm in No. 1, 0.6 μm in No. 2, 0.5 μm in No. 3, 0.6 μm in No. 4, 0.5 μm in No. 5, 0.4 μm in No. 6, 0.2 μm in No. 7, 0.0 μm in No. 8, 0.0 μm in No. 9, and 0.2 μm in No. 10. More specifically, in the plate materials Nos. 8 and 9, lipophilic portion forming particles were exposed to the surface of the thermosensitive layer in some parts.

<Production of a Lithographic Plate and Printing>

Each plate material of Nos. 1 to 10 was irradiated with a laser beam controlled in accordance with image data, using a laser plate-making device ("Trendsetter" on which a semiconductor laser device of 1W is mounted, produced by Creo Products Inc.) connected to an electronic composing device. The image data used herein was an image pattern composed of halftones of 10 mm×10 (2, 5, 10, 30, 50, 70, 90, 95, 98, 100%) and characters (10, 8, 6, 4, 2 points).

Because of this, only a part of the thermosensitive layer of the plate material irradiated with a laser beam was heated. As a result, a lipophilic portion (oil-based ink receiving portion) was formed in the heated portion, and a hydrophilic portion (oil-based ink non-receiving portion), in which a hydrophilic polymer was present, was formed in the other portion.

More specifically, by using these plate materials, lithographic plates are obtained in which an ink receiving portion and an ink non-receiving portion are formed on a printing surface in accordance with image data without performing a development process, by irradiating a laser beam controlled in accordance with image data. A portion of the plate material corresponding to the thermosensitive layer becomes a plate body of a lithographic plate.

The above-mentioned plate-making was performed under the same condition with respect to all the plate materials. Herein, plates obtained from the plate materials Nos. 1 to 10 are assumed to be lithographic plates Nos. 1 to 10.

Each plate (lithographic plates Nos. 1 to 10) thus obtained was trimmed and attached to an offset printer ("HAMADA VS34II" produced by Hamada Printing Press Co., Ltd.), and printing was performed with respect to fine paper. For performing an accelerating test, printing was performed by placing two under-sheets between the plate and the bracket to set the pressure therebetween to be higher than usual.

Furthermore, during printing, "Hartmann (HARTMANN Druckfarben GmbH)" was used as ink. As dampening water, purified water with 4% "CombifixXL (Hostmann-Steinberg Cell)" and 10% isopropyl alcohol added thereto was used. Printing was performed by operating a printer while supplying the ink and dampening water to a printing surface.

Printing using each plate was performed until printing resistance performance was degraded. The printing resistance performance was checked every 100th page for the following points. First, whether or not defects of 5% halftone were present was checked with a 30-magnification loupe. Second, whether or not an image of printed matter was clear, and whether or not a non-image portion of printed matter had any stain were visually judged. Third, the reflection density of a solid portion was measured by a reflection densitometer (SpectroEye, produced by GretagMacbeth Ltd.).

In printing, ink is retained in an ink receiving portion (lipophilic portion) of a printing surface, and the ink is pressed against a sheet of paper through a rubber blanket, whereby an image is formed. Furthermore, the non-image portion of printed matter is a portion where the ink non-receiving portion (hydrophilic portion) of the printing surface is pressed against the sheet of paper through the rubber blanket during printing.

As a result of the above-mentioned measurements, the printed matter was determined to have sufficient printing performance if it satisfies the following four points: (1) defects of 5% halftone are not observed; (2) the refraction density of a solid portion is 1.2 or more; (3) the image of printed matter is clear based on visual observation; and (4) the non-image portion of printed matter has no stain based on visual observation.

Furthermore, the sensitivity of the plate materials during plate-making was checked by the following method. First, plate-making was performed at each laser illuminance that allows an interval of 50 mJ/cm$^2$ to be obtained in a range of 300 mJ/cm$^2$ to 600 mJ/cm$^2$ for each plate material. Then, 1000 sheets were printed by using each lithographic plate thus obtained, and 1000th printed matter was evaluated for the above item (3). The smallest illuminance that satisfies the above-mentioned item (3) was set to be the sensitivity of a plate material for each plate material.

As a result, in printed matter using the lithographic plates Nos. 1 to 4 obtained by subjecting the plate materials Nos. 1 to 4 to plate-making, printing resistance performance was not degraded even when the number of printed sheets of paper exceeded 70,000. For printed matter using the lithographic plates Nos. 5 to 7 obtained by subjecting the plate materials Nos. 5 to 7 to plate-making, printing resistance performance was not degraded until 50,000th sheet was printed. However, when the number of printed sheets of paper exceeded 50,000, slight adhesion of ink was found in the non-image portion.

In contrast, in printed matter using the lithographic plate No. 8 obtained by subjecting the plate material No. 8 to plate-making, scumming was caused in the non-image portion at about 2000th printed sheet. In the printed matter using the lithographic plate No. 9 obtained by subjecting the plate material No. 9 to plate-making, scumming was caused in the non-image portion when the number of printed sheets of paper exceeded 20,000. In the printed matter using the lithographic plate No. 10 obtained by subjecting the plate material No. 10 to plate-making, the non-image portion was stained when the number of printed sheets of paper exceeded 3000.

Furthermore, in the lithographic plates Nos. 1 to 6, even when a printer was stopped during printing, and dampening water was not supplied to the lithographic plate for about 30 minutes, the surface of the lithographic plate remained wet without being dried. Thus, it was confirmed that the lithographic plates Nos. 1 to 6 had high water retention property. In the lithographic plate No. 7, the surface thereof remained wet without being dried, if it was not supplied with dampening water for about 10 minutes.

In the lithographic plate No. 9, in the case where a printer was stopped during printing, and dampening water was not supplied to the lithographic plate for about 30 minutes, a part of the surface of the lithographic plate remained wet without being dried; however, some portions were dried after 10 minutes or less.

Furthermore, the sensitivity of plate-making was 400 $mJ/cm^2$ in the plate material Nos. 1 to 6, 450 $mJ/cm^2$ in the plate material No.7, and 500 $mJ/cm^2$ in the plate material No. 9.

It is found from the above that the lithographic plates Nos. 1 to 7 obtained by subjecting the plate materials Nos. 1 to 7 to plate-making, which correspond to the examples of the present invention have remarkably high printing resistance performance and water retention property while having mechanical strength required for printing plates, compared with the lithographic plates Nos. 8 to 10 obtained by subjecting the plate materials Nos. 8 to 10 to plate-making, which correspond to the comparative examples of the present invention.

Furthermore, in the plate materials Nos. 1 to 7 corresponding to the examples of the present invention, even when the portion in which lipophilic portion forming particles are not present on the surface side of the thermosensitive layer is formed with a thickness of 0.2 $\mu$m or more, a clear image can be obtained with relatively low energy, i.e., 400 $mJ/cm^2$ or 450 $mJ/cm^2$; therefore, it is understood that the plate materials Nos. 1 to 7 are also excellent in plate-making sensitivity.

Furthermore, it is understood that, among the lithographic plates Nos. 1 to 7, the lithographic plates Nos. 1 to 6 in which a surface portion has a porous configuration have higher water retention property and plate-making sensitivity, compared with the lithographic plate No. 7 in which the surface portion does not have a porous configuration.

INDUSTRIAL APPLICABILITY

As described above, according to the present invention, in a thermosensitive plate material for lithographic plate formation requiring no development process, a plate material is provided, in which printing performance (in particular, a non-image portion is unlikely to be stained) of printed matter by a lithographic plate obtained by plate-making is improved, and which has mechanical strength required for a printing plate. Furthermore, since the water retention power of the lithographic plate obtained by plate-making is increased, the amount of dampening water to be used during printing can be reduced.

Consequently, by using the plate material of the present invention, a CTP system capable of streamlining a plate-making process, shortening a plate-making time, and reducing materials can be used as a practical system in the field of commercial printing.

What is claimed is:

1. A thermosensitive plate material for lithographic plate formation, comprising a thermosensitive layer having fine particles that are changed by heat to form lipophilic portions on a printing surface and an organic polymer, which is supported by a substrate, characterized in that:

a surface portion that is on a surface side of the thermosensitive layer does not contain the fine particles and contains a metal oxide, a hydrophilic organic polymer is cured with the metal oxide, and the surface portion has a thickness of 0.1 $\mu$m or more; and a base portion that is on a substrate-side portion of the thermosensitive layer from the surface portion contains the fine particles in an organic polymer.

2. The thermosensitive plate material for lithographic plate formation according to claim 1, wherein the surface portion is porous.

3. The thermosensitive plate material for lithographic plate formation according to claim 1, wherein the organic polymer forming the surface portion has at least one kind of functional group selected from the group consisting of a carboxyl group, an amino group, and an amide group.

4. The thermosensitive plate material for lithographic plate formation according to claim 1, wherein the organic polymer forming the surface portion comprises an acrylic polymer or a methacrylic polymer.

5. A lithographic plate obtained by forming a lipophilic portion on a printing surface by changing the fine particles with heat, using the plate material according to claim 4.

6. The thermosensitive plate material for lithographic plate formation according to claim 1, wherein the metal oxide comprises tin oxide.

7. A lithographic plate obtained by forming a lipophilic portion on a printing surface by changing the fine particles with heat, using the plate material according to claim 6.

8. The thermosensitive plate material for lithographic plate formation according to claim 1, wherein the surface portion contains a photothermal conversion material.

9. The thermosensitive plate material for lithographic plate formation according to claim 1, wherein the surface portion contains a carbon black.

10. The thermosensitive plate material for lithographic plate formation according to claim 1, wherein the organic polymer forming the base portion comprises a hydrophilic organic polymer.

11. The thermosensitive plate material for lithographic plate formation according to claim 1, wherein the organic polymer forming the base portion is cured.

12. The thermosensitive plate material for lithographic plate formation according to claim 1, wherein the fine particles are micro-capsules containing a lipophilic component.

13. A lithographic plate obtained by forming a lipophilic portion on a printing surface by changing the fine particles with heat, using the plate material according to claim 1.

14. A process for producing a thermosensitive plate material for lithographic plate formation which includes a thermosensitive layer having fine particles that are changed by heat to form lipophilic portions on a printing surface and an organic polymer, which is supported by a substrate and in which a surface portion that is on a surface side of the thermosensitive layer does not contain the fine particles and contains a metal oxide, a hydrophilic organic polymer is cured with the metal oxide, and a base portion that is on a substrate-side portion of the thermosensitive layer from the surface portion contains the fine particles in an organic polymer, the process being characterized by comprising:

forming the base portion on the substrate; and coating the base portion with a coating liquid containing the hydrophilic organic polymer and the metal oxide that acts as a curing agent of the organic polymer and drying the coating liquid to form the surface portion.

15. A coating liquid used in the process for producing the thermosensitive plate material for lithographic plate formation according to claim 14, characterized by comprising a hydrophilic organic polymer and a metal oxide that acts as a curing agent of the organic polymer.

16. The coating liquid according to claim 15, wherein the organic polymer has at least one kind of functional group selected from the group consisting of a carboxyl group, an amino group, and an amide group.

17. The coating liquid according to claim 15, wherein the organic polymer comprises an acrylic polymer or a methacrylic polymer.

18. The coating liquid according to claim 15, wherein the metal oxide comprises tin oxide.

19. The coating liquid according to claim 15, characterized by further comprising a photothermal conversion material.

20. The coating liquid according to claim 15, characterized by further comprising a carbon black.

21. A lithographic plate obtained by forming a lipophilic portion on a printing surface by changing the fine particles with heat, using the plate material produced by the method according to claim 14.

* * * * *